United States Patent
Matsushima

[11] Patent Number: 5,947,675
[45] Date of Patent: Sep. 7, 1999

[54] CASSETTE TRANSFER MECHANISM

[75] Inventor: Keiichi Matsushima, Kofu, Japan

[73] Assignee: Tokyo Electron Limited, Japan

[21] Appl. No.: 08/967,397

[22] Filed: Nov. 11, 1997

[30] Foreign Application Priority Data

Nov. 13, 1996 [JP] Japan .................................. 8-317126

[51] Int. Cl.$^6$ .................................................. B65G 49/07
[52] U.S. Cl. .......................... 414/416; 414/217; 414/940
[58] Field of Search .................................. 414/217, 331, 414/416, 935, 939, 940

[56] References Cited

U.S. PATENT DOCUMENTS

| | | | |
|---|---|---|---|
| 4,744,715 | 5/1988 | Kawabata | 414/331 |
| 4,781,511 | 11/1988 | Harada et al. | 414/331 X |
| 4,859,137 | 8/1989 | Bonora et al. | 414/940 X |
| 5,064,337 | 11/1991 | Asakawa et al. | 414/940 X |
| 5,110,248 | 5/1992 | Asano et al. | 414/217 X |
| 5,186,594 | 2/1993 | Toshima et al. | |
| 5,387,067 | 2/1995 | Grunes | 414/217 |
| 5,443,348 | 8/1995 | Biche et al. | 414/940 X |
| 5,507,614 | 4/1996 | Leonov et al. | |
| 5,525,024 | 6/1996 | Freerks et al. | 414/217 X |
| 5,538,385 | 7/1996 | Bacchi et al. | |
| 5,765,983 | 6/1998 | Caveney et al. | 414/217 |

FOREIGN PATENT DOCUMENTS 7-221159  8/1995  Japan .

Primary Examiner—James W. Keenan
Attorney, Agent, or Firm—Graham & James LLP

[57] ABSTRACT

A cassette transfer mechanism according to the present invention comprises a cassette chamber for containing a cassette for holding a plurality of objects to be processed, a cassette transfer port formed in the cassette chamber, for allowing the cassette to be transferred into and from the cassette chamber, an object transfer port formed in the cassette chamber and opened at a predetermined angle to an opening direction of the cassette transfer port, for allowing the objects to be transferred into and from the cassette chamber, an elevation table provided in the cassette chamber such that the elevation table can be elevated, a shaft installed rotatably on the elevation table and extending in a direction substantially perpendicular to an opening direction of the object transfer port, a cassette support table fixed to the shaft and having a bottom support portion for receiving a bottom surface of the cassette and a back surface support portion for receiving a back surface of the cassette, for orienting the cassette supported by the bottom support portion and the back surface support portion, in the opening direction of the object transfer port, and a rotation mechanism for rotating the cassette support table between a first position inside the cassette chamber and a second position outside the cassette chamber, by rotating the shaft in in response to operation of the elevation table.

6 Claims, 12 Drawing Sheets

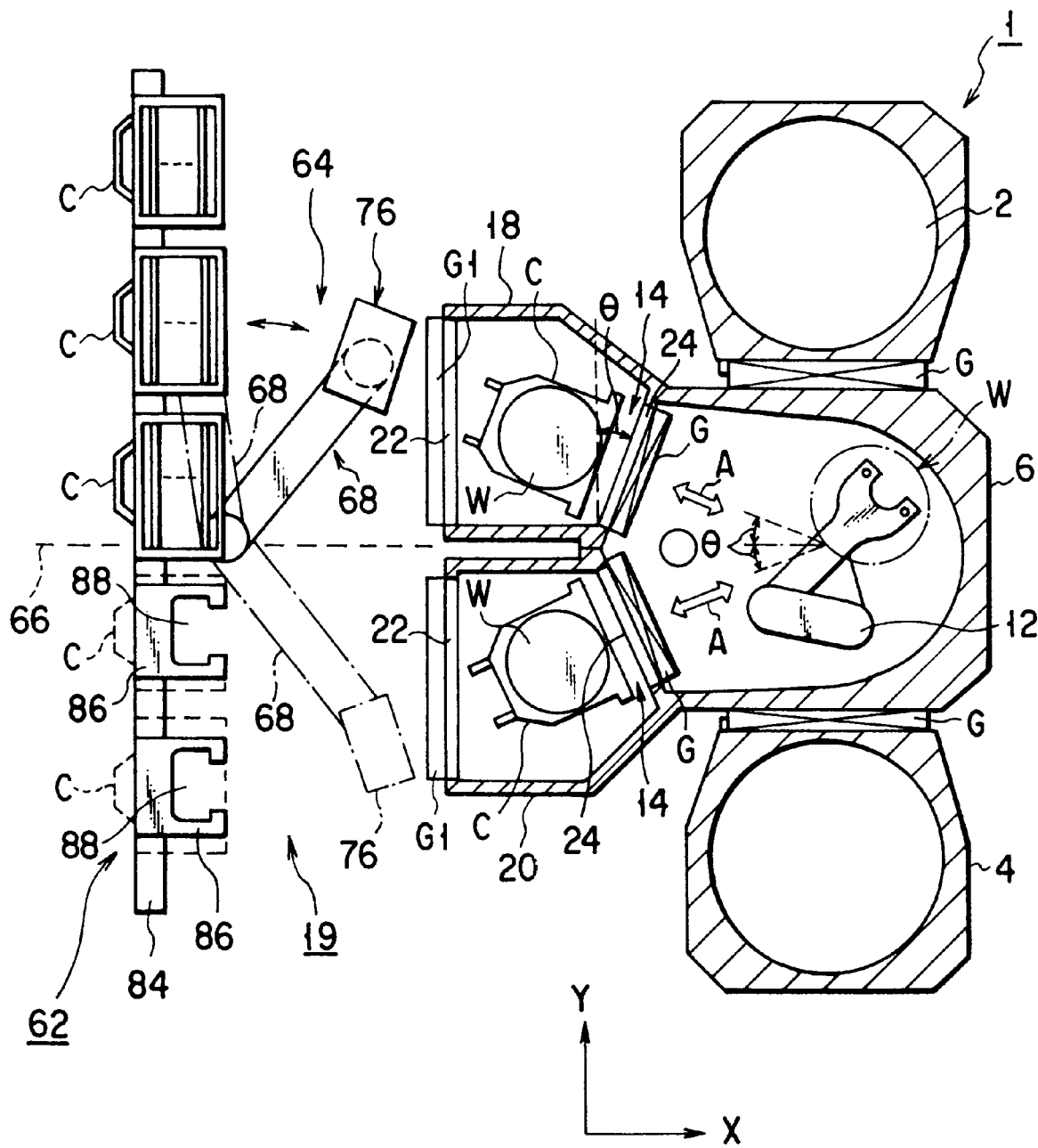
F I G. 1

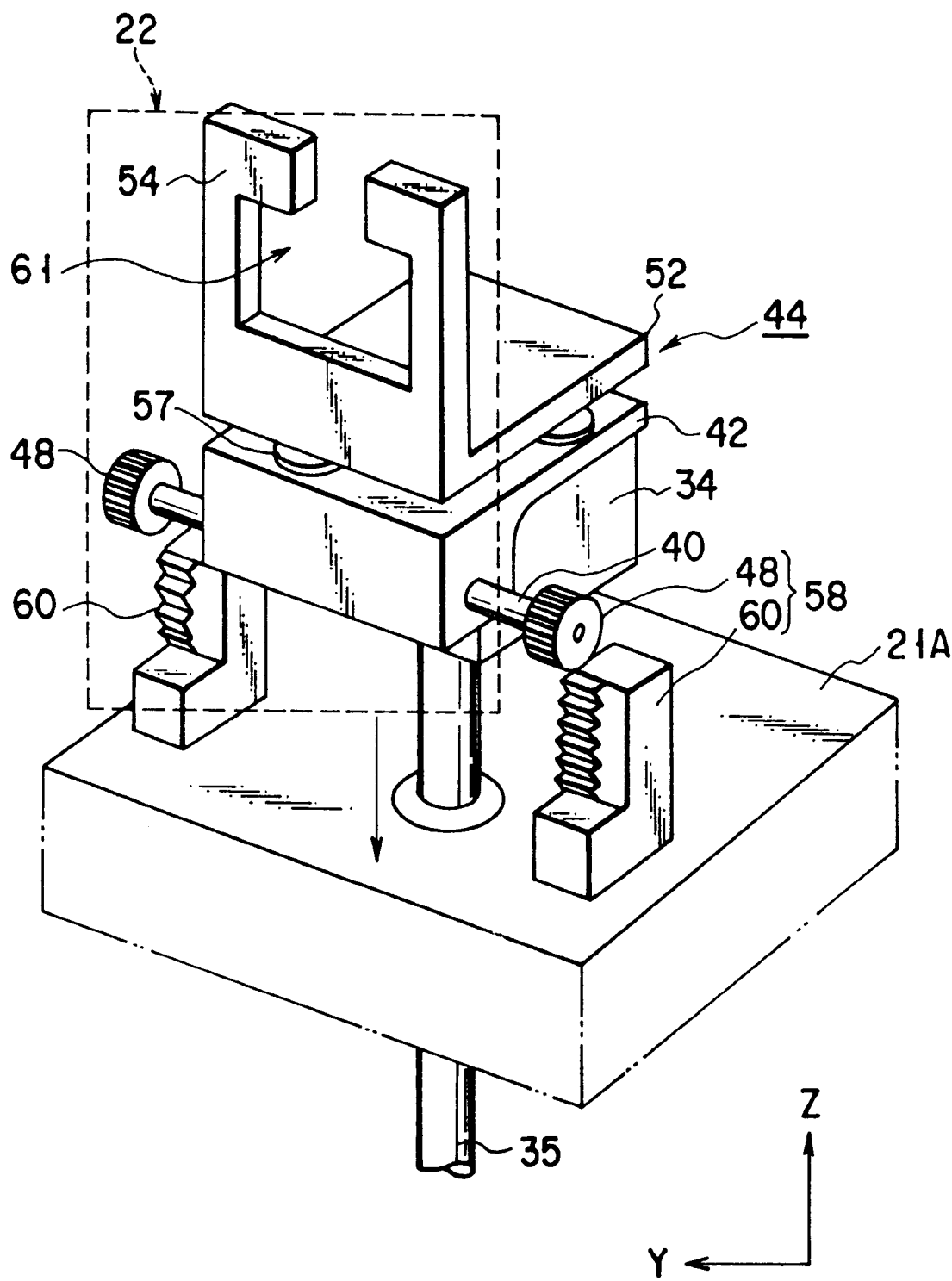
F I G. 4

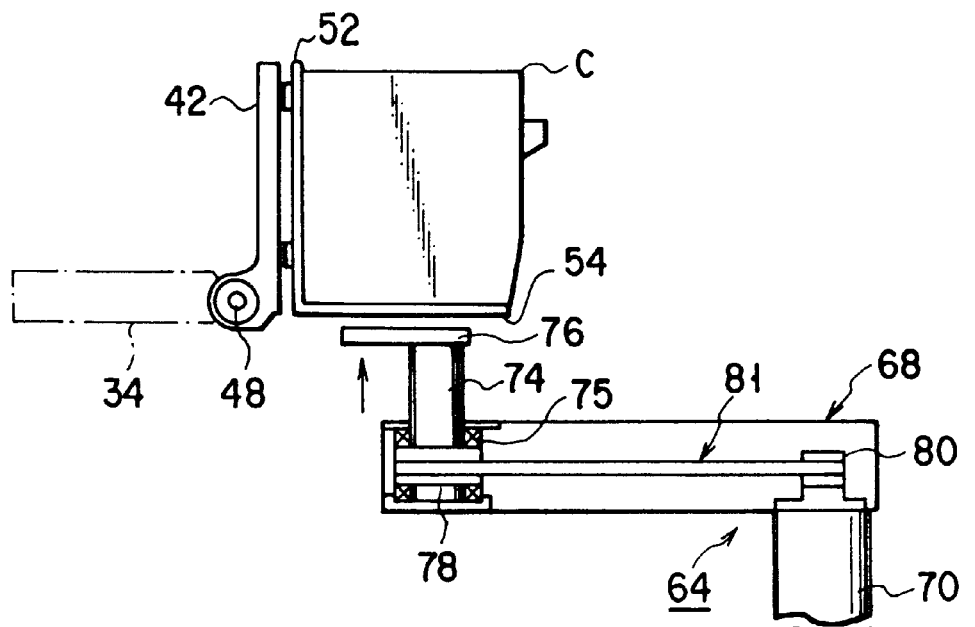
F I G. 7A
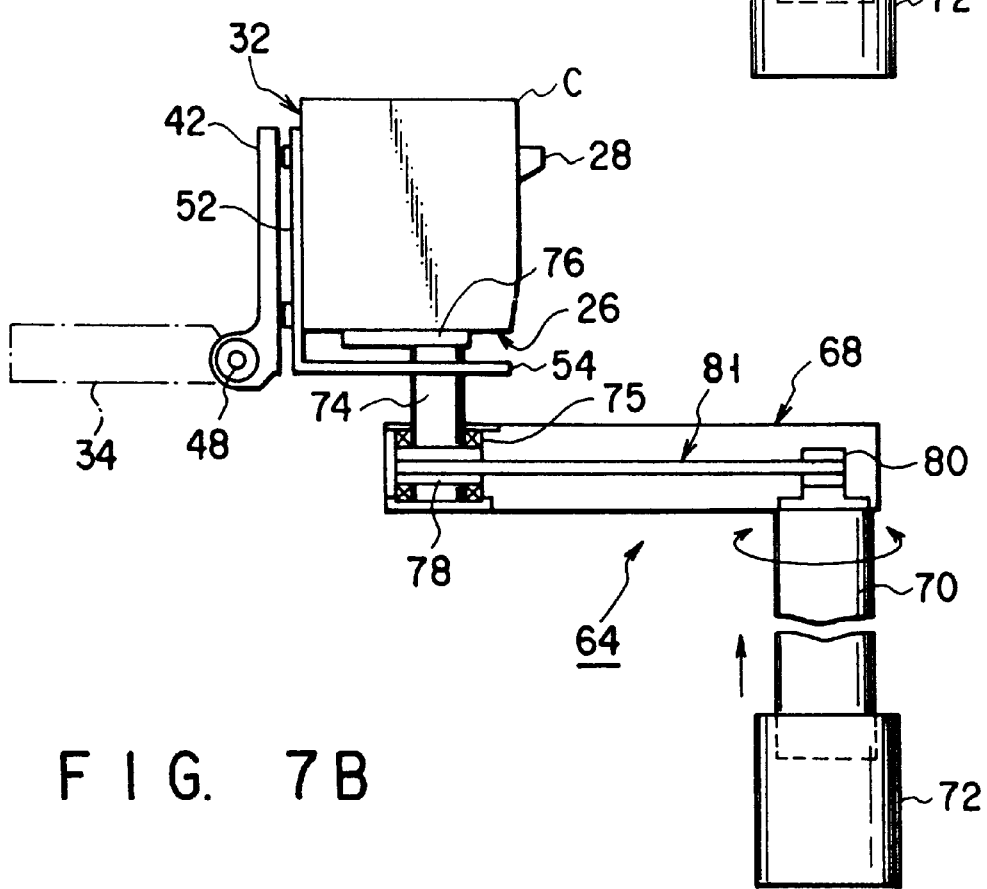
F I G. 7B

1

CASSETTE TRANSFER MECHANISM

BACKGROUND OF THE INVENTION

The present invention relates to a cassette transfer mechanism for transferring a cassette containing a target object such as a semiconductor wafer or the like to be processed between a stand-by position where a cassette is set and a target transfer position where a target object is taken out from the cassette.

In general, to make various kinds of processing such as film formation processing, etching processing, or thermal oxidation processing on a semiconductor wafer or the like, a cassette including a number of wafers, e.g., twenty five wafers is contained in a cassette chamber. The wafers in the cassette thus contained in the cassette chamber are thereafter sent to a processing chamber through a transfer chamber by a transfer arm, under a vacuum atmosphere.

When a cassette is set in the cassette chamber, the cassette is set on a stage of the cassette chamber, with the wafer transfer port of the cassette oriented upwards. Thereafter, the cassette is taken into the cassette chamber while being rotated by about 90° by a drive mechanism of a drawbridge type provided in the cassette chamber, and the wafer port is oriented in the horizontal direction from an upward direction.

In general, a plurality of cassette chambers, e.g., two cassette chambers are connected to one transfer chamber having one transfer arm. Therefore, in order that one transfer arm can make access with each of cassettes in two cassette chambers, each of the cassettes is oriented such that its wafer port once oriented in the horizontal direction faces in the moving direction of the transfer arm.

FIG. 12 shows a cluster tool apparatus which sends a semiconductor wafer W to a process chamber and makes processing on the wafer, by a series of operation as described above. This cluster tool apparatus mainly comprises two process chambers 2 and 4, a transfer chamber 6 connected to the process chambers 2 and 4, and two cassette chambers 8 and 10 connected to the transfer chamber 6. The chambers communicate with each other by gate valves G which can be closed air-tightly. As shown in FIG. 13, the transfer chamber 6 includes a transfer arm 12 of, for example, a multi-joint type which can be bent and rotated and transfers in and out semiconductor wafers W contained in cassettes C in the cassette chambers 8 and 10.

Due to the structure of the entire system and other conditions, each of cassettes C must be set on a stage outside the gate doors G1 of cassette chambers 8 and 10, such that the cassette C itself faces in the X-axis direction and such that its wafer port 14 is oriented upwards (in the Z-axis direction). Therefore, in order to take in cassettes C into cassette chambers 8 and 10 and to take out semiconductor wafers W from the cassettes C in the two cassette chambers 8 and 10, by one transfer arm 12, the cassettes C must be rotated in the horizontal direction while vertically raising up the cassettes C, thereby to orient the wafer ports 14 in the center direction (or the moving direction A) of the transfer arm 12.

Apparatuses which carry out an operation as described above are disclosed in, for example, U.S. Pat. No. 5186594, U.S. Pat. No. 5507614, and the like. In the U.S. Pat. No. 5186594, a cassette C set on a stage outside a cassette chamber 8 with its wafer transfer port 14 kept upwards is rotated by 90° around the Y-axis in the figure by a drawbridge type drive mechanism, to be taken into a cassette chamber 8, and the wafer transfer port 14 facing upwards (in the Z-axis direction) is oriented to the horizontal direction (in the X-axis direction). In the next, the cassette C is rotated by a predetermined angle θ around the Z-axis in the figure, by a pivot mechanism, thereby to orient the wafer transfer port 14 to the center of an arm 12 (ref. FIG. 14). In addition, in U.S. Pat. No. 5507614, a cassette C is situated at a predetermined position and the wafer transfer port 14 is oriented to the center of the arm 12, at a breath, by rotating the inclination axis directed at a predetermined angle with respect to the gravity direction.

Meanwhile, since the apparatus of U.S. Pat. No. 5186594 requires a pivot mechanism in addition to a drive mechanism of a drawbridge type, i.e., since a drive mechanism for rotating a cassette C by 90° around the Y-axis and a drive mechanism for rotating the cassette C by a predetermined angle around the Z-axis are individually required, the number of drive mechanisms in a vacuum chamber must be increased and the drive mechanisms must be complicated, resulting in that the manufacture costs are increased and the amount of particles thereby generated is also increased. The apparatus of U.S. Pat. No. 5507614 has a structure in which a rotation shaft extending obliquely is rotated and driven. Therefore, the rotation mechanism of this apparatus includes a larger deviated portion in comparison with a mechanism adopting horizontal rotation and driving, and accordingly, the amount of particles generated is increased. In addition, since a cassette C is rotated in an oblique direction, the space required for rotation is enlarged and the chamber has a large size.

BRIEF SUMMARY OF THE INVENTION

The present invention has an object of providing a cassette transfer mechanism for transferring a cassette containing a target object such as a semiconductor wafer or the like to be processed, between a stand-by position where the cassette is set and a target object transfer position where the target object is taken out from the cassette, and in particular, a cassette transfer mechanism which reduces generation of particles in a cassette chamber, enables down-sizing of the cassette chamber, and is capable of orienting a wafer transfer port of the cassette in the cassette chamber, in the direction in which the target object is transferred, i.e., in the access direction of a transfer arm.

The object of the present invention is achieved by a cassette transfer mechanism as follows. The cassette transfer mechanism comprises: a cassette chamber for containing a cassette for holding a plurality of objects to be processed; a cassette transfer port formed in the cassette chamber, for allowing the cassette to be transferred into and from the cassette chamber; an object transfer port formed in the cassette chamber and opened at a predetermined angle to an opening direction of the cassette transfer port, for allowing the objects to be transferred into and from the cassette chamber; an elevation table provided in the cassette chamber such that the elevation table can be elevated; a shaft installed rotatably on the elevation table and extending in a direction substantially perpendicular to an opening direction of the object transfer port; a cassette support table fixed to the shaft and having a bottom support portion for receiving a bottom surface of the cassette and a back surface support portion for receiving a back surface of the cassette, for orienting the cassette supported by the bottom support portion and the back surface support portion, in the opening direction of the object transfer port; and a rotation mechanism for rotating the cassette support table between a first position inside the cassette chamber and a second position outside the cassette chamber, by rotating the shaft in accordance with elevation operation of the elevation table.

Additional object and advantages of the invention will be set forth in the description which follows, and in part will be obvious from the description, or may be learned by practice of the invention. The object and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a cross-sectional view schematically showing a cluster tool apparatus including a cassette transfer mechanism according to an embodiment of the present invention.

FIG. 4 is a perspective view showing a state in which a cassette support table is set at a wafer transfer position in a cassette chamber shown in FIG. 2.

FIG. 7A is a side view showing a first embodiment of operation of an arm portion forming part of a cassette transfer mechanism.

FIG. 7B is a side view showing a first embodiment of operation of an arm portion forming part of a cassette transfer mechanism.

DETAILED DESCRIPTION OF THE INVENTION

Figure 2:
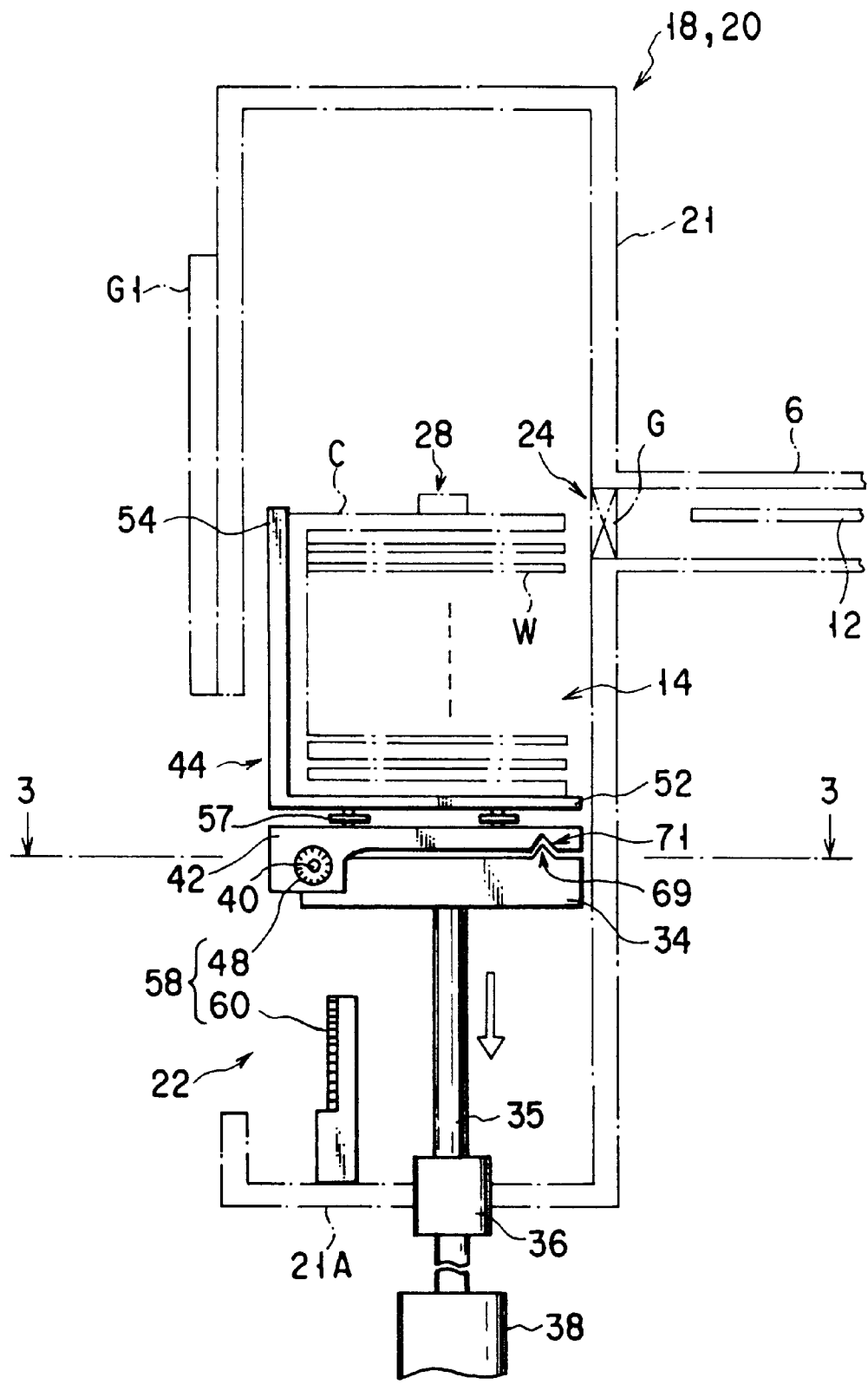
FIG. 2 is a side view schematically showing an internal structure of a cassette chamber of the cassette transfer mechanism shown in FIG. 1.

In the following, an embodiment of the present invention will be explained with reference to the drawings.

FIG. 1 shows a cluster tool apparatus 1 for sending a semiconductor wafer W to a process chamber and for subjecting the wafer to processing, through a series of operation steps. This cluster tool apparatus 1 mainly comprises two process chambers 2 and 4, a transfer chamber 6 connected to the process chambers 2 and 4, and two cassette chambers 18 and 20 connected to the transfer chamber 6. The chambers can be communicated with each other through gate valves G which can be closed air-tightly. In the transfer chamber 6, there is provided a transfer arm 12 of, for example, a multi-joint type which can be bent and rotated and transfers in and out semiconductor wafers W contained in the cassettes C in the cassette chambers 18 and 20. A cassette transfer mechanism 19 for transferring the cassettes C to and from the cassette chambers 18 and 20 is provided outside the apparatus 1 facing the gate doors G1 of the cassette chambers 18 and 20.

As shown in FIGS. 1 and 2, each of the cassette chambers 18 and 20 has a rectangular chamber container 21 made of, aluminum. A cassette transfer port 22 which allows a cassette C to pass is provided on one side of the chamber container 21. The cassette transfer port 22 is opened and closed by a gate door G1. container 21, there is provided a wafer outlet port 24 connected to the transfer chamber 6 through a gate valve G which can be opened and closed. As shown in FIG. 1, the cassette transfer port 22 is opened in the X-direction in the figure, and the wafer outlet port 24 is opened in a direction extending at an angle θ (e.g., 22.5°) with respect to the X-direction, i.e., the access direction A of the transfer arm 12 provided in the transfer chamber 6 with respect to the cassette chambers 18 and 20.

Figure 11:
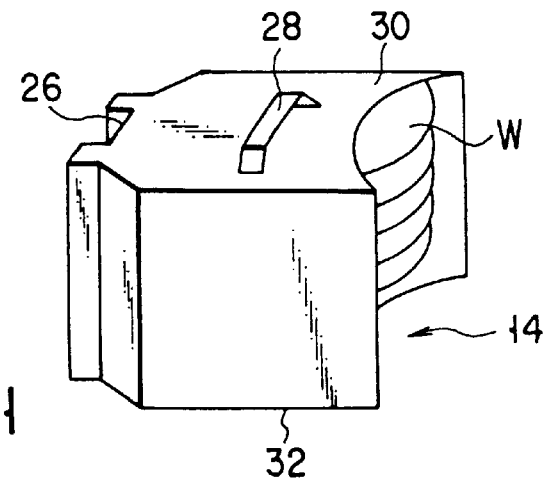
FIG. 11 is a perspective view of a cassette.
Figure 12:
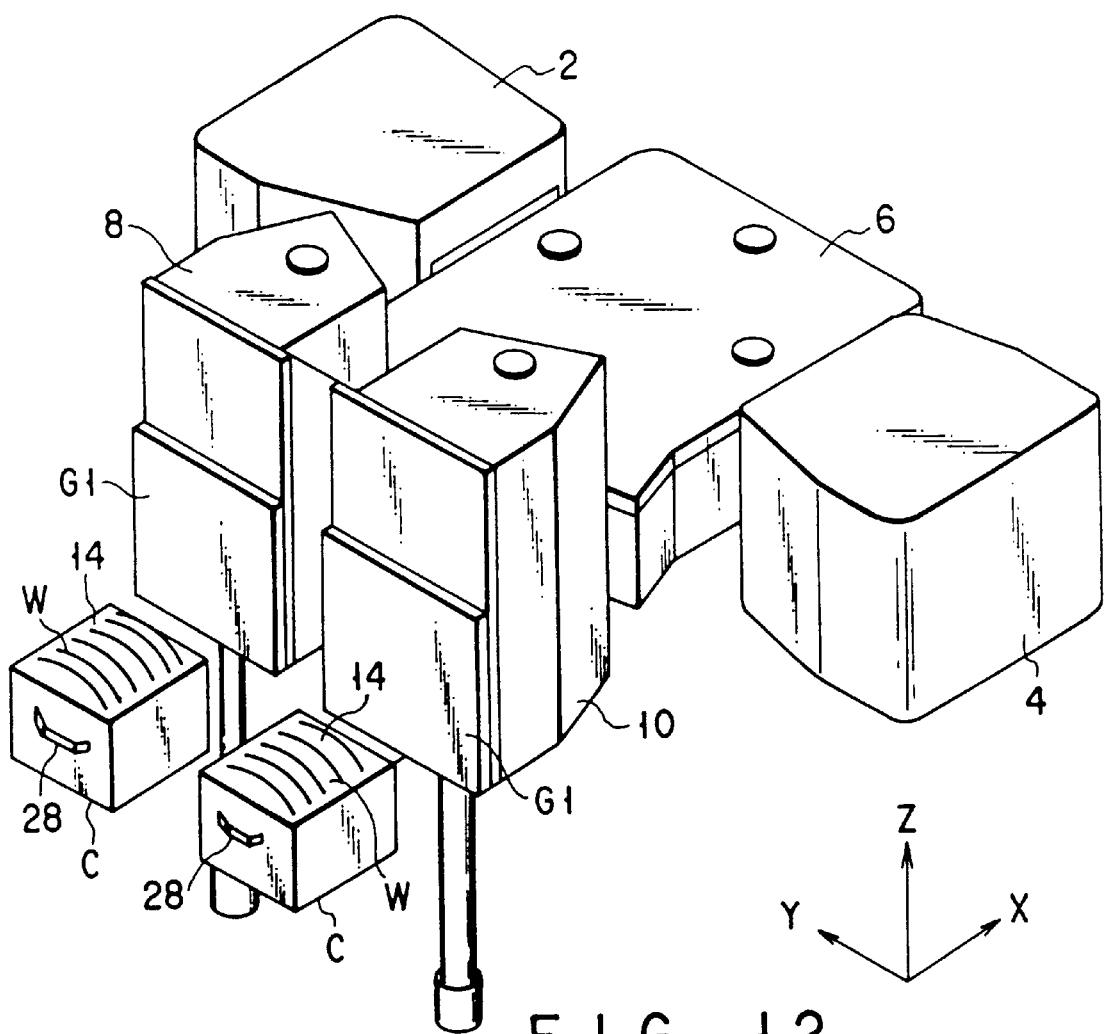
FIG. 12 is a perspective view of a typical cluster tool apparatus having a cassette chamber.
Figure 13:
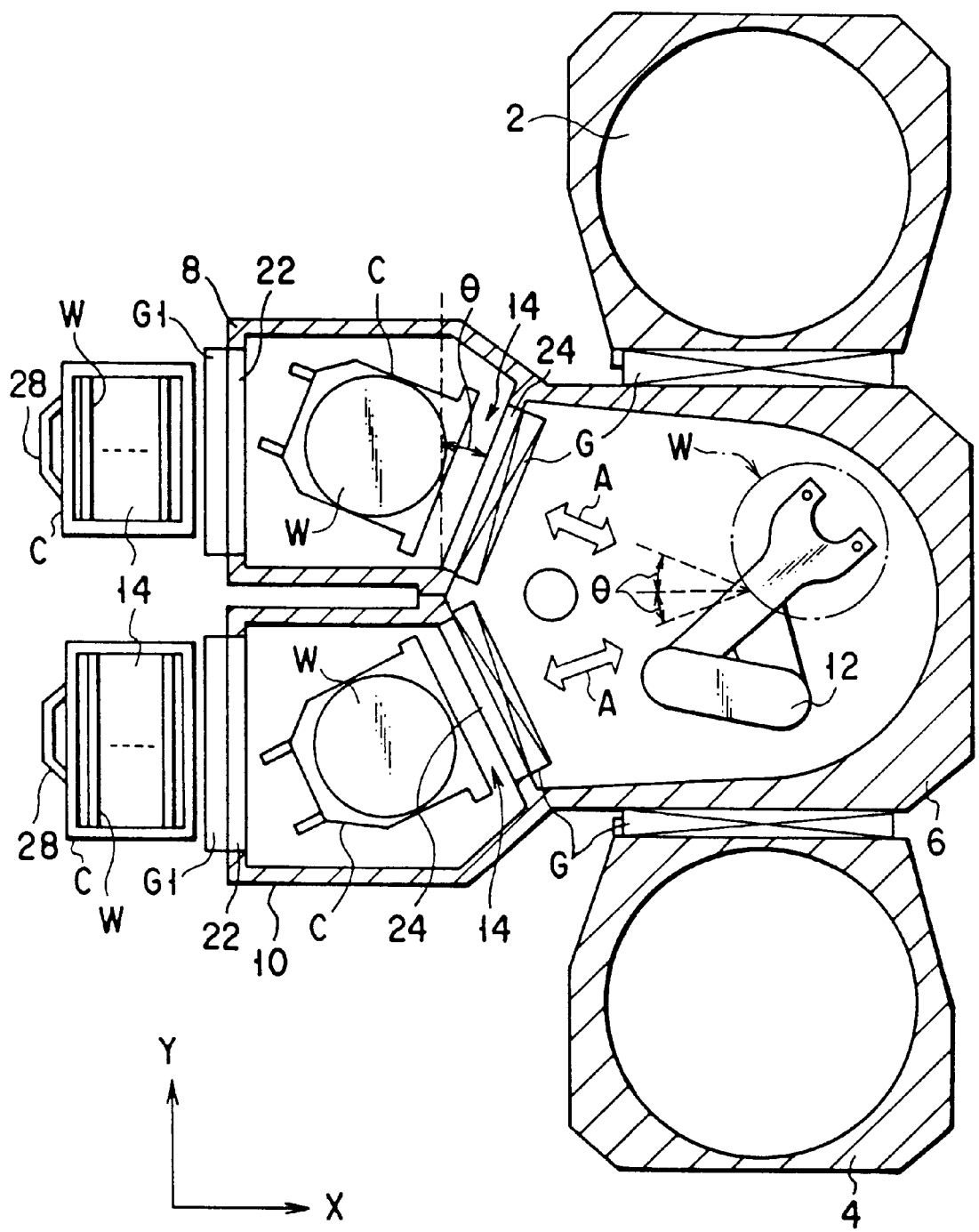
FIG. 13 is a cross-sectional view showing a cluster tool apparatus shown in FIG. 12, viewed from the upper side of the apparatus.
Figure 14:
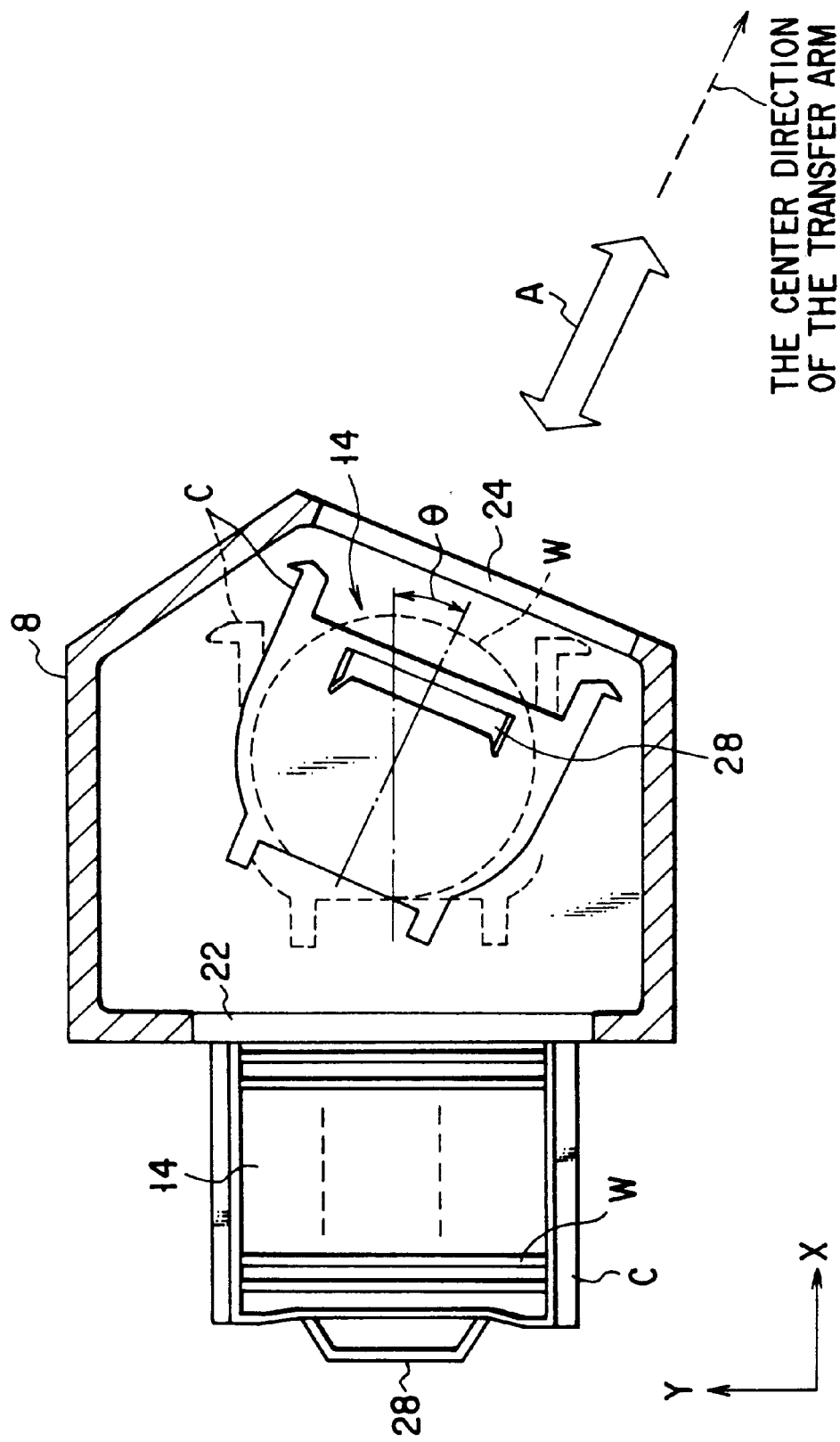
FIG. 14 is a plan view for explaining a conventional method of setting a cassette at a wafer transfer position.

Note that each of the cassettes C is capable of internally containing, for example, twenty five semiconductor wafers W. Each cassette C further has a wafer transfer port 14 through which semiconductor wafers W are transferred in and out, as shown in FIG. 11, and the side of the cassette C opposite to the wafer transfer port 14 is formed as a back surface 26. In addition, each cassette C has a bottom surface 32 and an upper surface 30 provided with a grip 28.

As shown in FIG. 2, an elevation seat 34 is provided in the chamber container 21. An elevation rod 35 is connected to the lower surface of the elevation seat 34. The elevation rod 35 penetrates a bottom portion 21A of the chamber container 21, with air-tightness kept, for example, by an O-ring seal 36. The elevation rod 35 is elevated by an elevation mechanism 38.

Figure 3:
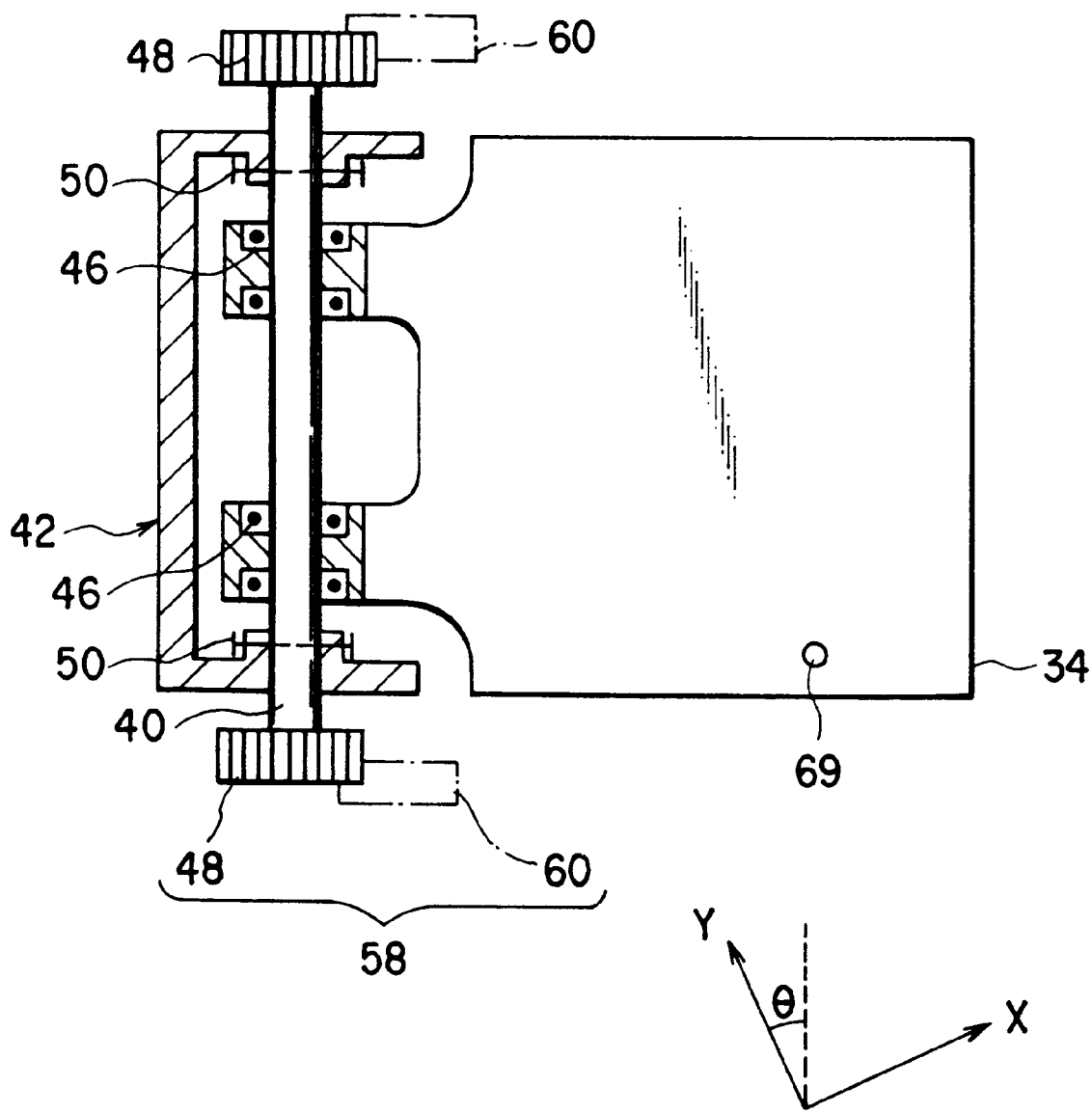
FIG. 3 is a cross-sectional view cut along a line 3—3 shown in FIG. 2.

As shown in FIGS. 2 to 4, a main shaft 40 is rotatably supported through two bearings 46 (shown in FIG. 3) on a side portion of the elevation seat 34 positioned in the vicinity of the cassette transfer port 22. The main shaft 40 extends in parallel with the wafer outlet port 24. Specifically, the main shaft 40 extends in the direction perpendicular to the access direction A of the transfer arm 12 with respect to the cassette chambers 18 and 20, and has a predetermined angle θ (e.g., 22.5°) with respect to the Y-direction in the figure. Pinion gears 48 forming part of a rotation mechanism 58 described later are fixed to both ends of the main shaft 40. In order to restrict generation of particles, the pinion gears 48 are preferably made of resin having a relatively high hardness. In addition, an auxiliary seat 42 is fixed to the main shaft 40 by a screw 50 (as shown in FIG. 3). Therefore, the auxiliary seat 42 rotates integrally with the main shaft 40.

As shown in FIGS. 2 and 4, the auxiliary seat 42 is equipped with an L-shaped cassette support table 44. The cassette support table 44 comprises a bottom support portion 52 for receiving and holding the bottom surface 32 of the cassette C and a back surface support portion 54 for receiving and holding the back surface 26 of the cassette C. In this case, the bottom support portion 52 is installed on the auxiliary seat 42, for example, through three height adjust screws 57 (only two of which are shown in FIG. 2). The back surface support portion 54 is connected at right angles to the bottom support portion 52, and has a concave insertion hole 61 (shown in FIG. 4) in which a cassette receive portion 76 (shown in FIG. 1) of the cassette transfer arm portion 64 described later can be detachably inserted. In addition, the cassette support table 44 is installed on the auxiliary seat 42 such that the back surface support portion 54 faces in the axcess direction A of the transfer arm 12 with the auxiliary seat 42 positioned horizontally as shown in FIG. 2 (or FIG. 4). Note that the height and the horizontal level of the cassette support table 44 can be adjusted by adjusting the height adjust screws 57.

As is clearly shown in FIGS. 2 and 4, two fixing racks 60 are provided so as to stand on the bottom portion 21A of the chamber container 21, at the position which can be engaged with the pinion gear 48. In order to restrict generation of particles, these fixing racks 60 are preferably made of resin having a relatively high hardness.

The fixing racks 60 together with the pinion gears 48 form a rotation mechanism 58 for rotating the cassette support table 44. Specifically, the fixing racks 60 are engaged with and rotate the pinion gears 48 which are elevated in accordance with elevation operation of the elevation rod 35, so that the main shaft 40 is rotated thereby also rotating the cassette support table 44 fixed to the main shaft 40 through the auxiliary seat 42. More specifically, the tooth shapes and the heights of the fixing racks 60 are arranged such that the pinion gears 48 can be rotated by 90° and such that the pinion gears 48 sinking are rotated in the anti-clockwise direction while the pinion gears 48 rising are rotated in the clockwise direction. This means, the rotation mechanism 58 rotates the cassette support table 44 by 90° in the anti-clockwise direction to make the cassette support table 44 projected to the outside of the cassette chambers 18 and 20 through the cassette transfer port 22 when the elevation seat 34 sinks, while the rotation mechanism 58 rotates the cassette support table 44 by 90° in the clockwise direction to make the cassette support table 44 positioned inside the cassette chambers 18 and 20 when the elevation seat 34 rises.

In order to position the cassette support table 44 with respect to the elevation seat 34, a convex portion 69 is provided in the upper surface of the elevation seat 34, and a concave portion 71 which can be engaged with the convex portion 69 is provided in the lower surface of the auxiliary seat 42 (as shown in FIG. 2).

As shown in FIG. 1, a cassette transfer mechanism 19 for transferring cassettes C into and from cassette chambers 18 and 20 comprises a cassette port table 62 where a plurality of cassettes C can be mounted, and a cassette transfer arm portion 64 for transferring cassettes C between the cassette port table 62 and the cassette chambers 18 and 20. The base portion of the cassette transfer arm portion 64 is positioned on the center line 66 between the two cassette chambers 18 and 20, such that cassettes C can be transferred into and from the two cassette chambers 18 and 20 by one arm portion 64.

Figure 8:
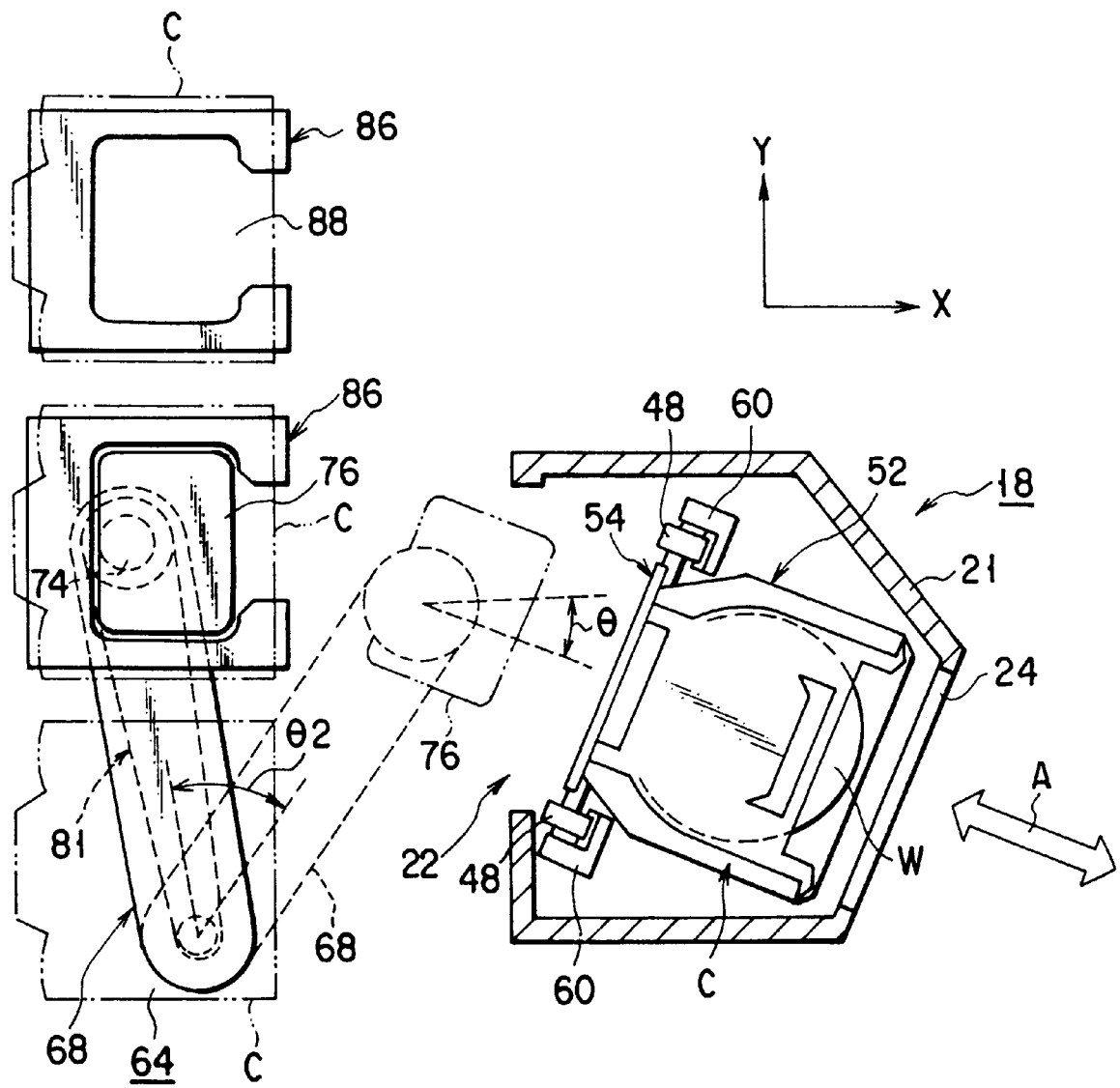
FIG. 8 is a view showing a state in which a wafer transfer portion of a cassette is oriented in the access direction of a transfer arm in a cassette chamber.

As shown in FIGS. 7A and 7B, the arm portion 64 has a cylindrical arm body 68. The base portion of the arm body 68 is fixed to a rotatable rotation shaft 70 positioned on the center line 66. The rotation shaft 70 is elevated upwards and downwards by a predetermined stroke, by an elevation mechanism 72. A cassette receive shaft 76 is rotatably supported on the top of the arm body 68, by a bearing 75. A rectangular cassette receive portion 76 which has a direct contact with the back surface 26 of the cassette C thereby supporting the cassette C is installed on the upper end of the cassette receive shaft 74. A large diameter pulley 78 is fixed to the base portion of the cassette receive shaft 74, and a small diameter pulley 80 is fixed to the upper end of the rotation shaft 70. A belt 81 is bridged between both of the pulleys 78 and 80. Therefore, when the rotation shaft 70 is rotated to rotate the arm body 68, the belt 81 is rotated and the cassette receive shaft 74 is rotated by a predetermined angle. In the present embodiment, particularly as shown in FIG. 8, the arm body 68 is rotated by an angle θ2 in order to move the cassette receive portion 76 between a first position (indicated by a continuous line) where a cassette C is transferred to the cassette port table 62 and a second position (indicated by a broken line) where the cassette C is transferred to the cassette chamber 18 (or 20). In addition, the cassette receive portion 76 facing in the X-direction at the first position faces in the access direction A of the transfer arm 12 at the second position. Specifically, diameters of both the pulleys 78 and 80 are set such that the cassette receive shaft 74 is rotated by an angle θ (e.g., 22.5°) in the same direction as the rotation direction of the arm body 68 in accordance with rotation of the belt 81 when the arm body 68 is rotated by an angle θ2. As long as the diameters of both the pulleys 78 and 80 are thus arranged, the rotation relationship between the arm body 68 and the cassette receive shaft 74 is satisfied where the arm body 68 is rotated by 180° from the state shown in FIG. 8. Specifically, this rotation relationship is satisfied not only between the cassette port table 62 and the cassette chamber 18 but also between the cassette port table 62 and the cassette chamber 20 (shown in FIG. 1).

Figure 10:
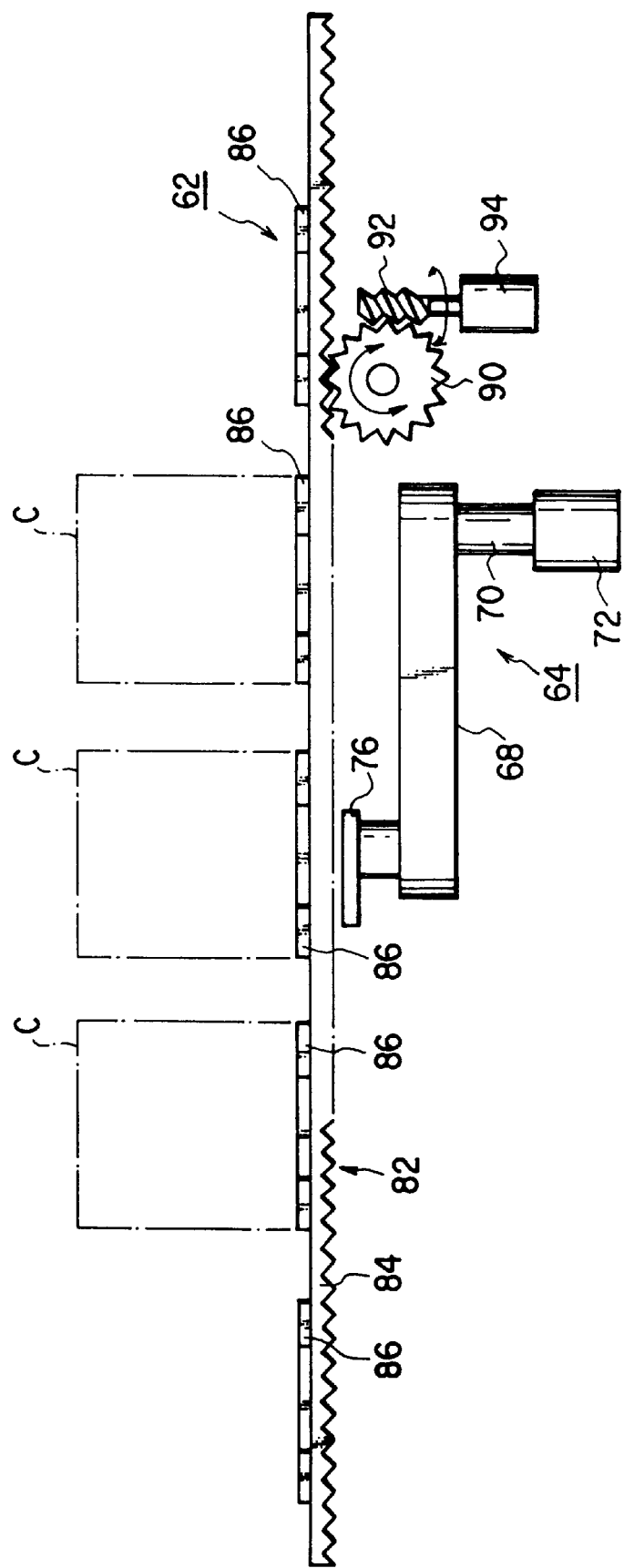
FIG. 10 is a side view of a cassette port table forming part of a cassette transfer mechanism.

FIG. 10 shows a detailed structure of the cassette port table 62. As shown in the figure, the cassette port table 62 has a long movable table 84. On the movable table 84, cassette mount tables 86 are provided at a predetermined pitch. As specifically shown in FIG. 8, each cassette mount table 86 is made of a rectangular plate material, and has a concave insertion hole 88 in which the cassette receive portion 76 of the cassette transfer arm portion 64 can be detachably inserted. A tooth 82 to be engaged with a rotation gear 90 is formed on the lower surface of the movable table 84. The rotation gear 90 is engaged with a worm gear 92 installed on the rotation drive shaft of a drive motor 94. Therefore, the rotation gear 90 is rotated thereby moving the movable table 84 in the horizontal direction, when the warm gear 92 is rotated in accordance with driving of the drive motor 94.

Note that the movable table 84 may be moved, for example, by a driving belt or a linear guide.

In the next, operation of the cassette chambers 18 and 20 and the cassette transfer mechanism 19 constructed as described above will be explained below.

FIGS. 2 and 4 show a state where a cassette C holding semiconductor wafers W is positioned at a wafer transfer position above a chamber container 21. In this state, the cassette support table 44 is oriented in the access direction A (or the moving direction) of the transfer arm 12. Therefore, the cassette C mounted on the cassette support table 44 is also arranged such that the wafer transfer port 14 is opposed to a wafer outlet port 24 of the chamber container 21 and is oriented in the access direction A of the transfer arm 12 in the transfer chamber 6. In this state, the load of the cassette C is supported by the bottom support portion 52 of the cassette support table 44.

Figure 5:
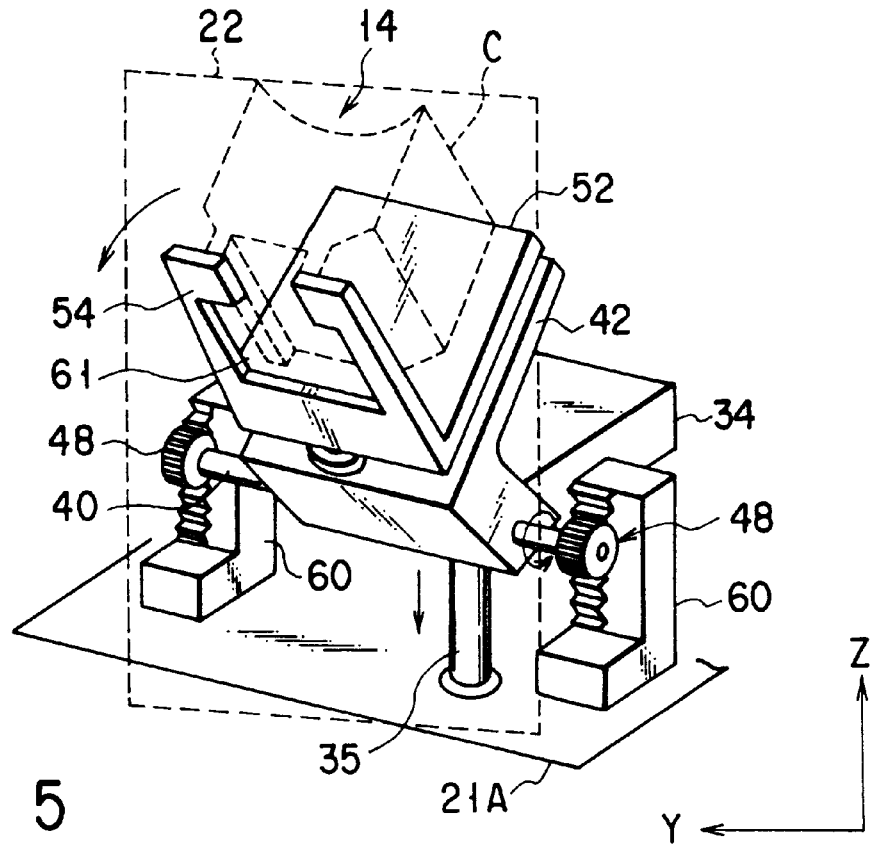
FIG. 5 is a perspective view showing a cassette rotated by a rotation mechanism of a cassette chamber shown in FIG. 2.

In order to unload the cassette C from the state shown in FIGS. 2 and 4, the elevation rod 35 is moved downwards by the elevation mechanism 38, at first, to elevate down the elevation seat 34. When the elevation seat 34 is elevated down to a predetermined height, the pinion gears 48 fixed to both sides of the main shaft 40 are engaged with the tooth of fixing racks 60 standing on the bottom portion 21A. When the elevation seat 34 is further elevated down with the pinion gears 48 kept engaged with the fixing racks 60, the main shaft 40 integral with the pinion gears 48 is elevated down, rotating in the anti-clockwise direction (as shown in FIG. 5). Therefore, the auxiliary seat 42 and the cassette support table 44 fixed to the main shaft 40 are also elevated down, rotating in the anti-clockwise direction, so that the wafer transfer port 14 of the cassette C facing in the horizontal direction is oriented in the upward direction.

Figure 6:
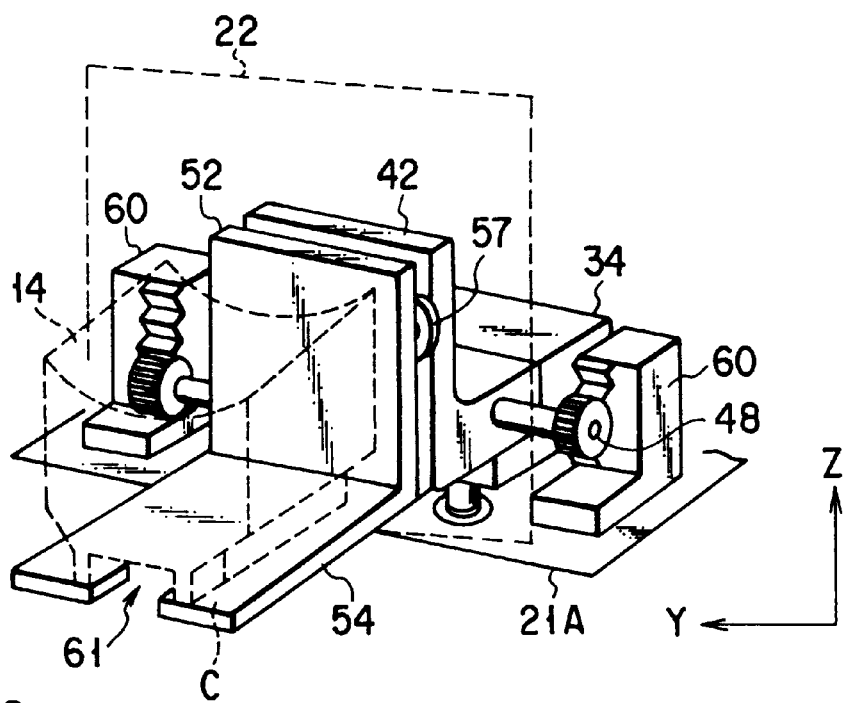
FIG. 6 is a perspective view showing a cassette rotated by 90° by a rotation mechanism of a cassette chamber shown in FIG. 2.
Figure 9:
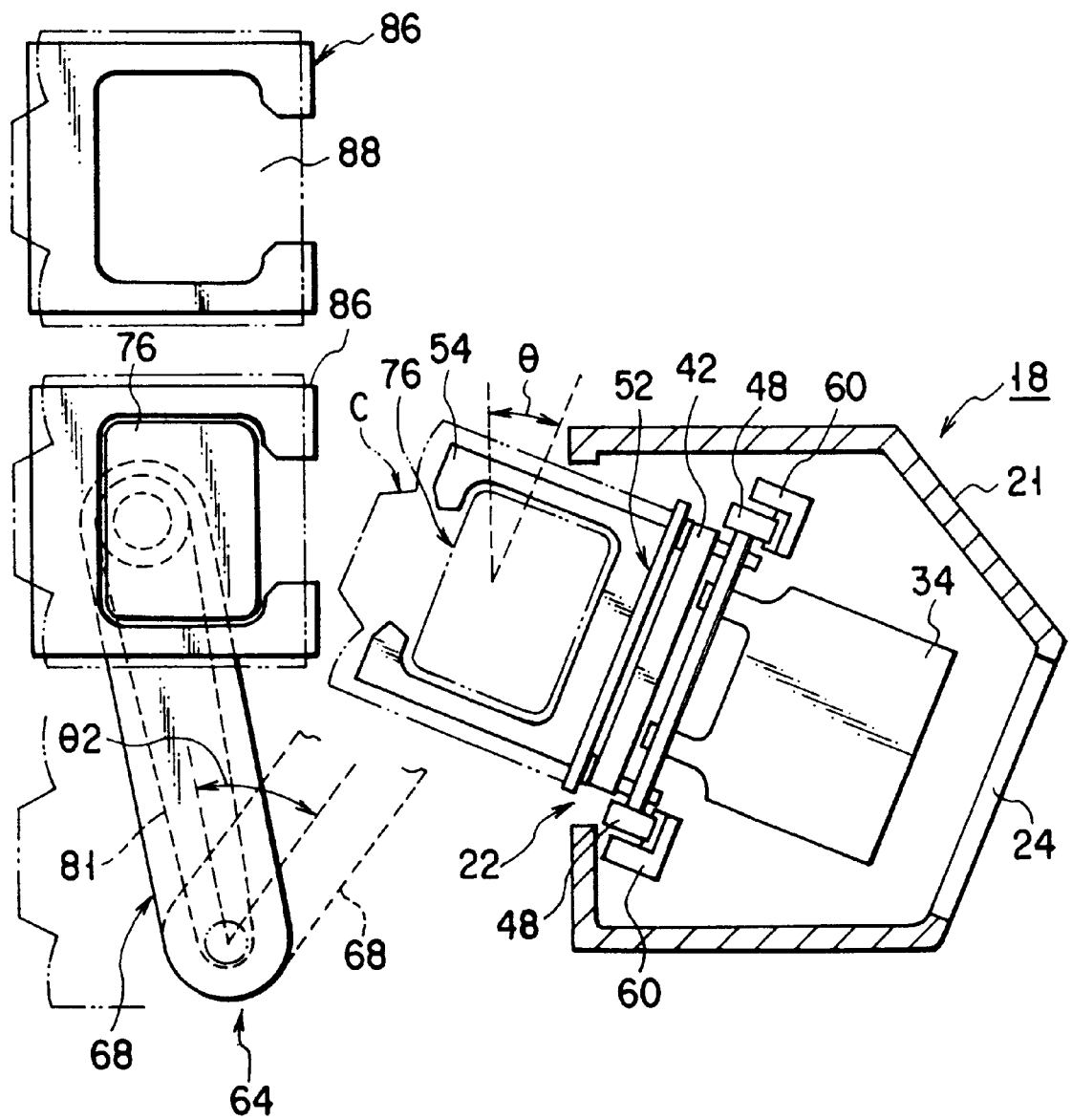
FIG. 9 is a view showing a state in which a cassette rotated together with a cassette support table is set at a position outside a cassette chamber.

When the cassette support table 44 is thus elevated down to a predetermined height, rotating in the anti-clockwise direction, the cassette C together with the cassette support table 44 is projected to the outside of the chamber container 21 through the cassette transfer port 22. Further, at the time when the cassette table 44 is rotated by 90° in the anti-clockwise direction, downward elevation of the elevation seat 34 is stopped and the cassette support table 44 stops rotating any more. This state is shown in FIGS. 6 and 9. As shown in these figures, the back surface support portion 54 projects to the outside of the chamber container 21 from the cassette transfer port 22 and is oriented in the horizontal direction. Therefore, the cassette C also projects to the outside of the chamber container 21, and the load of the cassette C is supported by the back surface support portion 54, so that the wafer transfer port 14 is oriented upwards (in the Z-axis direction). Off course, in this state, the back surface support portion 54 and the cassette C are oriented at a predetermined angle θ with respect to the X-direction, and are kept facing in the access direction A of the transfer arm 12.

After the cassette support table 44 and the cassette C are set in the state shown in FIG. 6, the rotation shaft 70 of the cassette transfer mechanism 19 is rotated by an angle θ2. As a result, the arm body 68 fixed to the rotation shaft 70 is rotated by an angle θ2 from the first position indicated by a continuous line in FIGS. 8 and 9 to the second position indicated by a broken line. Therefore, the cassette receive portion 76 provided at the top of the arm body 68 is oriented in the access direction A of the transfer arm 12 by the driving of the belt 81, and is positioned below the back surface support portion 54 (as shown in FIG. 7A).

After the cassette receive portion 76 is situated at the position shown in FIG. 7A, the elevation mechanism 72 is driven so that the rotation shaft 70 is elevated up by a predetermined stroke. Specifically, the arm body 68 is elevated up by a predetermined distance, so that the cassette receive portion 76 rises through an insertion hole 61 (shown in FIG. 4). Therefore, the cassette C is lifted by the cassette receive portion 76 having a contact with the back surface 26 and is made apart from the cassette support table 44 (as shown in FIG. 7B).

In the next, the rotation shaft 70 is rotated in the direction opposite to the preceding rotation direction in the state shown in FIGS. 7, and the arm body 68 is rotated to the first position (indicated by a continuous line shown in FIG. 8). This means, the cassette C is moved to the cassette port table 62. In this state, the cassette receive shaft 74 for supporting the cassette receive portion 76 moves apart from the back surface support portion 54 through an open end of the insertion hole 61.

When the arm body 68 is rotated by an angle θ2 from the second position to the first position, the cassette receive portion 76 is oriented in the X-direction by the driving of the belt 81. Therefore, the cassette C on the cassette receive portion 76 is oriented in the X-direction. When the arm body 68 is thus situated at the first position, the cassette receive shaft 74 enters into the insertion hole 88 through an open end of the insertion hole 88 of the cassette mount table 86 previously waiting at the cassette transfer position by a movement of the movable table 84. Therefore, the cassette C is held over the cassette mount table 86 by the cassette receive portion 76 installed at the top end of the cassette receive shaft 74. In this state, when the rotation shaft 70 is next elevated down by a predetermined distance, the cassette receive portion 76 moves down through the insertion hole 88 of the cassette mount table 86 and the cassette C held by the cassette receive portion 76 is transferred to the cassette mount table 86. In this state, the cassette C is mounted on the cassette mount table 86 with the transfer port 14 oriented upwards (in the Z-direction).

Note that selection of the cassette mount table 86 where a cassette C should be mounted, i.e., movement of the desired cassette mount table 86 to the cassette transfer position is performed by appropriately moving the movable table 84 in the horizontal direction by rotating and driving the rotation gear 90 through a drive motor 94.

Meanwhile, when the cassette C on the cassette port table 62 is transferred into the cassette chamber 18 or 20, the operation steps explained above are performed in the reverse manner. Specifically, at first, an operator sets a cassette C containing unprocessed semiconductor wafers W on the cassette mount table 86 of the cassette port table 62. In this case, the cassette C is oriented in the X-direction and is mounted on the cassette mount table 86 with the transfer port 14 oriented upwards. In the next, the movable table 84 is moved horizontally and the cassette mount table 86 where the cassette C is mounted is situated at the cassette transfer position where there cassette receive portion 76 is waiting.

When the cassette C together with the cassette mount table 86 is situated at the cassette transfer position, the cassette receive portion 76 is moved upwards through the insertion hole 88 of the cassette mount table 86 and the cassette C held by the cassette receive portion 76 is moved apart from the cassette mount table 86. Next, in this state, the arm body 68 is rotated by an angle θ2 from the first position, to be situated in the second position, and the cassette C is transferred onto the back surface support portion 54 of the cassette support table 44 waiting in the state shown in FIG. 6, by performing the operation steps described above in the reverse order. In this case, before the arm body 68 together with the cassette C is rotated to the second position, the cassette table 44 is rotated by 90° in the anti-clockwise direction by the rotation mechanism 58 and projects to the outside of the chamber container 21. Thereafter, the elevation seat 34 is elevated up, and then, the cassette support table 44 is elevated up, rotated by 90° in the clockwise direction, so that the bottom support portion 52 is set in a horizontal state. In this state, the cassette support table 44 and the wafer transfer port 14 of the cassette C are oriented in the access direction A (or the moving direction) of the transfer arm 12, as has been described before. When the elevation seat 34 is further elevated up to a predetermined height, the wafer transfer port 14 of the cassette C is opposed to the wafer outlet port 24 of the chamber container 21 opened in the access direction A.

As has been explained above, according to the present embodiment, a cassette C mounted on a cassette port table 62 and facing in the X-direction with its wafer transfer port 14 oriented upwards can be transferred to a cassette chamber 18 or 20 while rotating the cassette C in the access direction of the transfer arm 12, by means of the cassette transfer mechanism 19. In addition, according to the present embodiment, a cassette C horizontally laid with its wafer transfer port 14 facing upwards can be transferred into the cassette chamber 18 or 20 and moved to a wafer transfer position while making the cassette C stand up vertically, only by moving the elevation rod 35 upwards. In this case, since the cassette C is rotated around the main shaft 40 perpendicular to the access direction A of the transfer arm 12, the wafer transfer port 14 of the cassette C transferred to the cassette chamber 18 or 20 is oriented in the access direction A of the transfer arm 12 when the main shaft 40 is rotated by 90°.

Thus, in the present embodiment, the cassette C is previously oriented in the access direction A of the transfer arm 12 and is transferred onto the cassette support table 44 arranged so as to face in the access direction A of the transfer arm 12, by a cassette transfer mechanism 19 provided outside the cassette chambers 18 and 20. Further, the wafer transfer port 14 of the cassette C is oriented in the access direction A of the transfer arm 12, only by the rotation of the cassette support table 44 around the main shaft 40. Therefore, it is not necessary to provide a drive mechanism for orienting the cassette C in the access direction A of the transfer arm 12, in the cassette chamber 18 or 20. As a result, the number of drive mechanisms in the cassette chamber (or vacuum chamber) 18 or 20 is reduced, and generation of particles is thereby restricted. In contrast, according to U.S. Pat. No. 5186594, it is necessary to provide individually a drive mechanism for rotating a cassette C by 90° around the Y-axis and a drive mechanism for rotating the cassette C by a predetermined angle around the Z-axis, in a cassette chamber. Therefore, the number of drive mechanisms included in a cassette chamber is increased, so that manufacturing costs are increased and particles generated are increased. However, in case of cassette chambers 18 and 20 according to the present embodiment which does not require a drive mechanism for rotating a cassette C around the Z-axis, the number of drive mechanisms is smaller than the number of drive mechanisms in case of the apparatus according to U.S. Pat. No. 5186594, so that generation of particles can be restricted and costs can be reduced due to the simple structure.

The cassette chambers 18 and 20 according to the present embodiment do not include any rotation shaft extending obliquely, and therefore, the rotation mechanism portions thereof do not include a portion deviated like an oblique shaft shown in U.S. Pat. No. 5507614, so that the amount of particles generated is small. In addition, since it is not necessary to rotate the cassette C in any oblique direction, a space required for rotation is small and the chambers 18 and 20 can be manufactured in compact sizes.

Note that in the present embodiment, semiconductor wafers are cited as target objects to be processed. However, target objects are not limited to semiconductor wafers, but glass substrates, LCD substrates, or the likes may be used. In addition, the cassette chambers 18 and 20 can be applied not only to a cluster tool apparatus as described above, but also to other devices. Further, although the present embodiment adopts one cassette transfer mechanism 19 for two cassette chambers 18 and 20, cassette transfer mechanisms 19 may be respectively for cassette chambers 18 and 20.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalent.

I claim:

1. A cassette transfer mechanism comprising:

a cassette chamber for containing a cassette for holding a plurality of objects to be processed;

a cassette transfer port formed in the cassette chamber, for allowing the cassette to be transferred into and from the cassette chamber;

an object transfer port formed in the cassette chamber and opened at a predetermined angle to an opening direction of the cassette transfer port, for allowing the objects to be transferred into and from the cassette chamber;

an elevation table provided in the cassette chamber such that the elevation table can be elevated;

a shaft installed rotatably on the elevation table and extending in a direction substantially perpendicular to an opening direction of the object transfer port;

a cassette support table fixed to the shaft and having a bottom support portion for receiving a bottom surface of the cassette and a back surface support portion for receiving a back surface of the cassette, for orienting the cassette supported by the bottom support portion and the back surface support portion, in the opening direction of the object transfer port; and a rotation mechanism for rotating the cassette support table between a first position inside the cassette chamber and a second position outside the cassette chamber, by rotating the shaft in response to operation of the elevation table;

wherein the rotation mechanism comprises a rack provided in the cassette chamber and extending in an elevation direction of the elevation table, and a pinion gear fixed to the shaft and engaged with the rack.

2. A cassette transfer mechanism according to claim 1, wherein at least one of the rack and the pinion gear is made of resin.

3. A cassette transfer mechanism comprising:

a cassette chamber for containing a cassette for holding a plurality of objects to be processed;

a cassette transfer port formed in the cassette chamber, for allowing the cassette to be transferred into and from the cassette chamber;

an object transfer port formed in the cassette chamber and opened at a predetermined angle to an opening direction of the cassette transfer port, for allowing the objects to be transferred into and from the cassette chamber;

an elevation table provided in the cassette chamber such that the elevation table can be elevated;

a shaft installed rotatably on the elevation table and extending in a direction substantially perpendicular to an opening direction of the object transfer port;

a cassette support table fixed to the shaft and having a bottom support portion for receiving a bottom surface of the cassette and a back surface support portion for receiving a back surface of the cassette, for orienting the cassette supported by the bottom support portion and the back surface support portion, in the opening direction of the object transfer port;

a rotation mechanism for rotating the cassette support table between a first position inside the cassette chamber and a second position outside the cassette chamber, by rotating the shaft in response to elevation operation of the elevation table;

a cassette port table on which the cassette is set; and transfer means for transferring the cassette between the cassette port table and the cassette support table of the cassette chamber, wherein the transfer means transfers the cassette onto the cassette support table, with the cassette oriented in the opening portion of the object transfer port.

4. A cassette transfer mechanism according to claim 3, wherein the transfer means includes a support shaft, an arm rotatable around the support shaft, and a holding portion installed on a top end of the arm to hold the cassette, and the holding portion rotates by a predetermined amount in a same direction as a rotation direction of the arm, in accordance with rotation of the arm, thereby to orient the cassette in the opening direction of the object transfer port at a transfer position where the cassette held is transferred to the cassette support table.

5. A cassette transfer mechanism according to claim 3, wherein the transfer means includes a first rotation shaft which can be elevated and rotated, an arm fixed to the first rotation shaft, a first pulley fixed to the first rotation shaft, a second rotation shaft installed rotatably on an end portion of the arm, a second pulley fixed to the second rotation shaft, a belt bridged between the first and second pulleys, and a holding portion installed on the first rotation shaft to hold the cassette.

6. A cassette transfer mechanism according to claim 3, wherein the cassette port table includes a movable table extending in a direction substantially perpendicular to the opening direction of the cassette transfer port, drive means for driving the movable table, and a plurality of cassette mount tables provided on the movable table to mount the cassette.

* * * * *